(12) United States Patent
Yu

(10) Patent No.: US 12,470,862 B2
(45) Date of Patent: Nov. 11, 2025

(54) HYBRID MICROSPEAKER

(71) Applicant: EM-TECH Co., Ltd., Gyeongsangnam-do (KR)

(72) Inventor: Byung Min Yu, Seoul (KR)

(73) Assignee: EM-TECH Co., Ltd., Gyeongsangnam-do (KR)

( * ) Notice: Subject to any disclaimer, the term of this patent is extended or adjusted under 35 U.S.C. 154(b) by 254 days.

(21) Appl. No.: 18/136,403

(22) Filed: Apr. 19, 2023

(65) Prior Publication Data

US 2023/0345169 A1 Oct. 26, 2023

(30) Foreign Application Priority Data

Apr. 21, 2022 (KR) .......................... 1020220049531

(51) Int. Cl.
| | |
|---|---|
| *H04R 1/24* | (2006.01) |
| *H04R 9/02* | (2006.01) |
| *H04R 9/04* | (2006.01) |
| *H04R 9/06* | (2006.01) |
| *H05K 1/18* | (2006.01) |

(52) U.S. Cl.
CPC .............. *H04R 1/24* (2013.01); *H04R 9/025* (2013.01); *H04R 9/045* (2013.01); *H04R 9/046* (2013.01); *H04R 9/063* (2013.01); *H05K 1/189* (2013.01)

(58) Field of Classification Search
CPC . H04R 1/24; H04R 1/26; H04R 9/025; H04R 9/045; H04R 9/046; H04R 9/063; H04R 9/06; H05K 1/189

USPC .................................. 381/412, 396, 423
See application file for complete search history.

(56) References Cited

U.S. PATENT DOCUMENTS

| | | | | |
|---|---|---|---|---|
| 11,290,825 | B1 * | 3/2022 | Ko ............................ | H04R 9/06 |
| 2020/0245058 | A1 * | 7/2020 | Lee ......................... | H04R 9/025 |
| 2024/0022850 | A1 * | 1/2024 | Wang ....................... | H04R 7/04 |

FOREIGN PATENT DOCUMENTS

| | | | | | |
|---|---|---|---|---|---|
| CN | 112019979 | A | * 12/2020 | .............. | H04R 7/06 |
| KR | 20120122014 | A | 11/2012 | | |
| KR | 2013081803 | A | * 7/2013 | .............. | H04R 7/04 |
| KR | 20150056227 | A | 5/2015 | | |
| KR | 20180057045 | A | 5/2018 | | |

* cited by examiner

*Primary Examiner* — Ahmad F. Matar
*Assistant Examiner* — Sabrina Diaz
(74) *Attorney, Agent, or Firm* — Murphy, Bilak & Homiller, PLLC

(57) ABSTRACT

A hybrid microspeaker includes a low-frequency range speaker and a high-frequency range speaker. The low-frequency range speaker includes a frame, a low-frequency range magnetic circuit installed inside the frame, a voice coil configured to vibrate by mutual electromagnetic force with the low-frequency range magnetic circuit, and a diaphragm seated on the frame and configured to vibrate with the voice coil to generate sound. The high-frequency range speaker includes a bracket coupled to an upper portion of the frame, a high-frequency range magnetic circuit installed inside the bracket, and a flexible printed circuit board (FPCB) seated on the bracket and including a pattern configured to vibrate by mutual electromagnetic force with the high-frequency range magnetic circuit to generate sound.

7 Claims, 8 Drawing Sheets

HYBRID MICROSPEAKER

TECHNICAL FIELD

The present disclosure relates to a hybrid microspeaker capable of improving sound characteristics in a full audible sound range by combining a low-frequency range speaker and a high-frequency range speaker.

BACKGROUND

In general, hybrid speakers are speakers in which a low-frequency range speaker and a high-frequency range speaker are combined.

Dynamic speakers include a magnetic circuit, a voice coil, and a diaphragm. Therefore, when the voice coil and the diaphragm are vibrated by mutual electromagnetic force between the magnetic circuit and the voice coil, the diaphragm vibrates to generate sound.

Such dynamic speakers may have good magnetic field efficiency to improve low-frequency range acoustic characteristics, but since a relatively heavy coil is attached to the diaphragm, acoustic characteristics in high-frequency range may deteriorate. Therefore, dynamic speakers are often used as low-frequency range speakers.

Of course, a speaker with a dynamic structure may be designed as a speaker specialized for high-frequency sound, but a reaction speed may be somewhat slow because a force generated by a magnetic field is indirectly transferred to the diaphragm through the voice coil.

Meanwhile, flexible printed circuit board (FPCB) speakers include a magnetic circuit and an FPCB serving as a coil and diaphragm. Therefore, the FPCB itself vibrates by mutual electromagnetic force between the magnetic circuit and the coil of the FPCB to generate sound.

The FPCB speakers do not use a coil and the force based on the magnetic field is directly transferred to the FPCB serving as a diaphragm, and accordingly, the weight of a vibration meter may be significantly reduced and acoustic characteristics in high-frequency ranges may be improved. Therefore, FPCB speakers are widely used as high-frequency range speakers.

Meanwhile, the hybrid speaker is a two-way speaker in which a low-frequency range speaker and a high-frequency range speaker are combined. In most hybrid speakers, the low-frequency speaker and the high-frequency speaker are separated from each other, rather than configured as a single unit, causing a problem of distortion and heterogeneity due to a phase difference between the low-frequency speaker and the high-frequency speaker.

Therefore, a microspeaker having a hybrid structure capable of realizing large sound in the entire audible sound range may be implemented by combining the dynamic speaker specialized in low-frequency range and the FPCB speaker specialized in high-frequency range.

SUMMARY

An aspect of the embodiment is to provide a hybrid microspeaker capable of improving sound characteristics in the entire audible sound range by combining a low-frequency range speaker and a high-frequency range speaker.

According to an aspect of the present disclosure for achieving the above objects, there is provided a hybrid microspeaker that includes: a low-frequency range speaker including a frame, a low-frequency range magnetic circuit installed inside the frame, a voice coil configured to vibrate by mutual electromagnetic force with the high-frequency range magnetic circuit, and a diaphragm seated on the frame and configured to vibrate with the voice coil to generate sound; and a high-frequency range speaker including a bracket coupled to an upper portion of the frame, a high-frequency range magnetic circuit installed inside the bracket, and a flexible printed circuit board (FPCB) seated on the bracket and including a pattern configured to vibrate by mutual electromagnetic force with the high-frequency range magnetic circuit to generate sound.

The low-frequency range magnetic circuit may include: a yoke coupled to an inner circumferential surface and a lower side of the frame; a magnet disposed inside the yoke with an air gap therebetween; and a top plate disposed above the magnet, wherein a lower end of the voice coil is disposed in the air gap between a side surface of the yoke and the magnet.

The high-frequency range magnetic circuit may include a first magnetic circuit forming a magnetic field below the FPCB.

The first magnetic circuit may include: a first inner magnet disposed below the FPCB; a first outer magnet arranged to form an air gap outside the first inner magnet; and a first yoke disposed below the first inner magnet and the first outer magnet.

The high-frequency range magnetic circuit may further include a second magnetic circuit forming a magnetic field symmetrical to the first magnetic circuit above the FPCB.

The second magnetic circuit may include; a second inner magnet disposed above the FPCB; a second outer magnet disposed to form an air gap outside the second inner magnet; and a second yoke disposed above the second inner magnet and the second outer magnet and including a sound hole communicating with the air gap.

The low-frequency range speaker may further include a low-frequency range speaker terminal exposed to the outside of the frame to be connected to the voice coil to supply an electrical signal, and the high-frequency range speaker may further include a high-frequency range speaker terminal exposed to the outside of the bracket to be connected to the FPCB to supply an electrical signal.

At least one of the low-frequency range speaker terminal and the high-frequency range speaker terminal may be configured in the form of a pin terminal.

The low-frequency range speaker terminal may be configured in the form of a pin terminal, the high-frequency range speaker terminal may be configured such that a portion of the FPCB extends to be exposed to the outside of the bracket, and a cutout portion of the high-frequency range speaker terminal may be connected to the low-frequency range speaker terminal.

The FPCB may further include a capacitor operating only in a high frequency range.

According to the embodiment, the hybrid microspeaker may include the dynamic speaker-type low-frequency range speaker and the FPCB speaker-type high-frequency range speaker, and when the bracket of the high-frequency range speaker is assembled to an upper side of the frame of the low-frequency range speaker, the low-frequency range speaker and the high-frequency range speaker may be combined and integrated with each other.

Accordingly, distortion and heterogeneity of sound due to a phase difference between the low-frequency range speaker and the high-frequency range speaker may be minimized, and both low-frequency range sound characteristics and high-frequency range sound characteristics may be improved.

DETAILED DESCRIPTION

Figure 1:
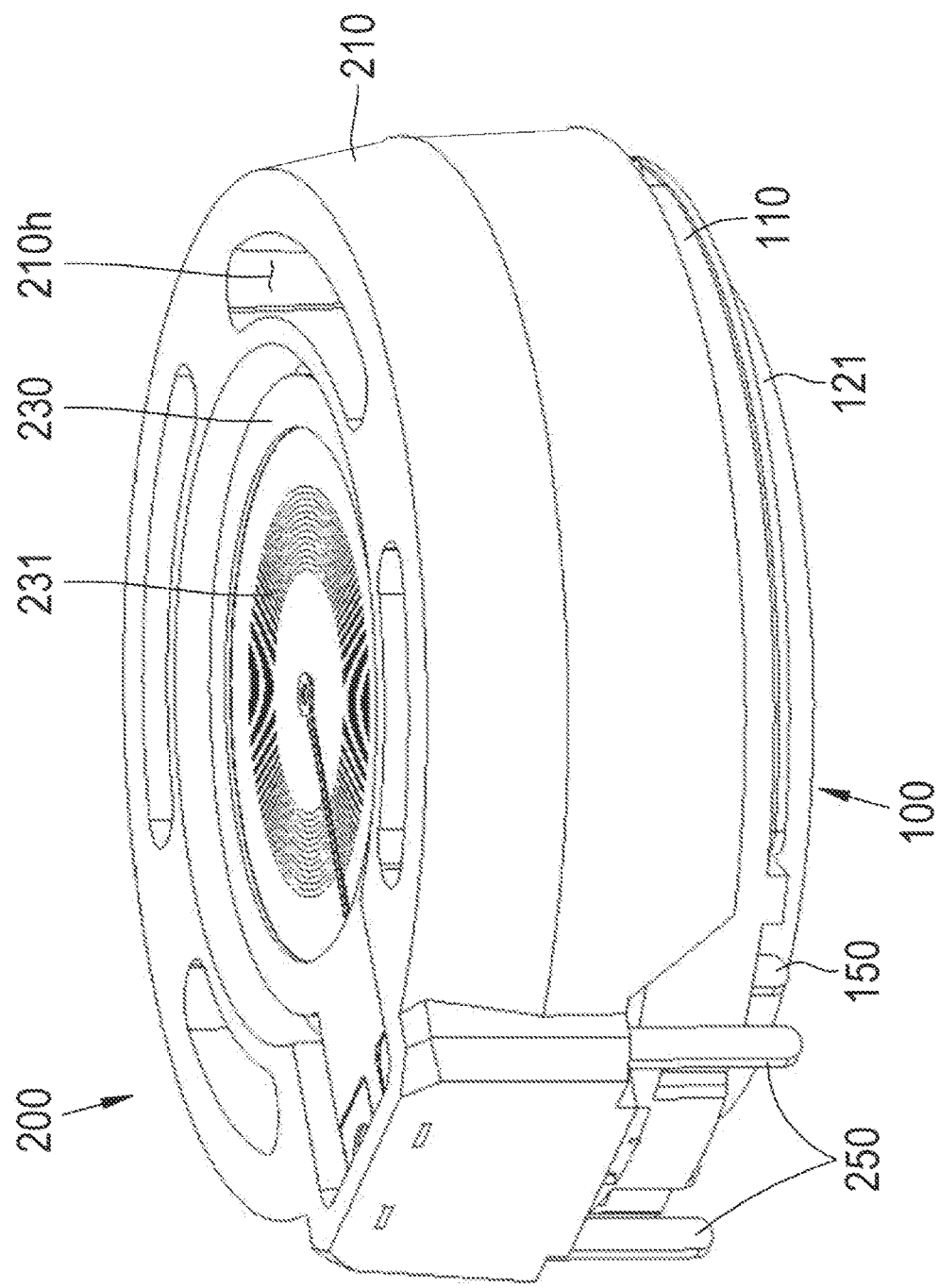
FIG. 1 is a perspective view illustrating a hybrid speaker according to an embodiment.
Figure 2:
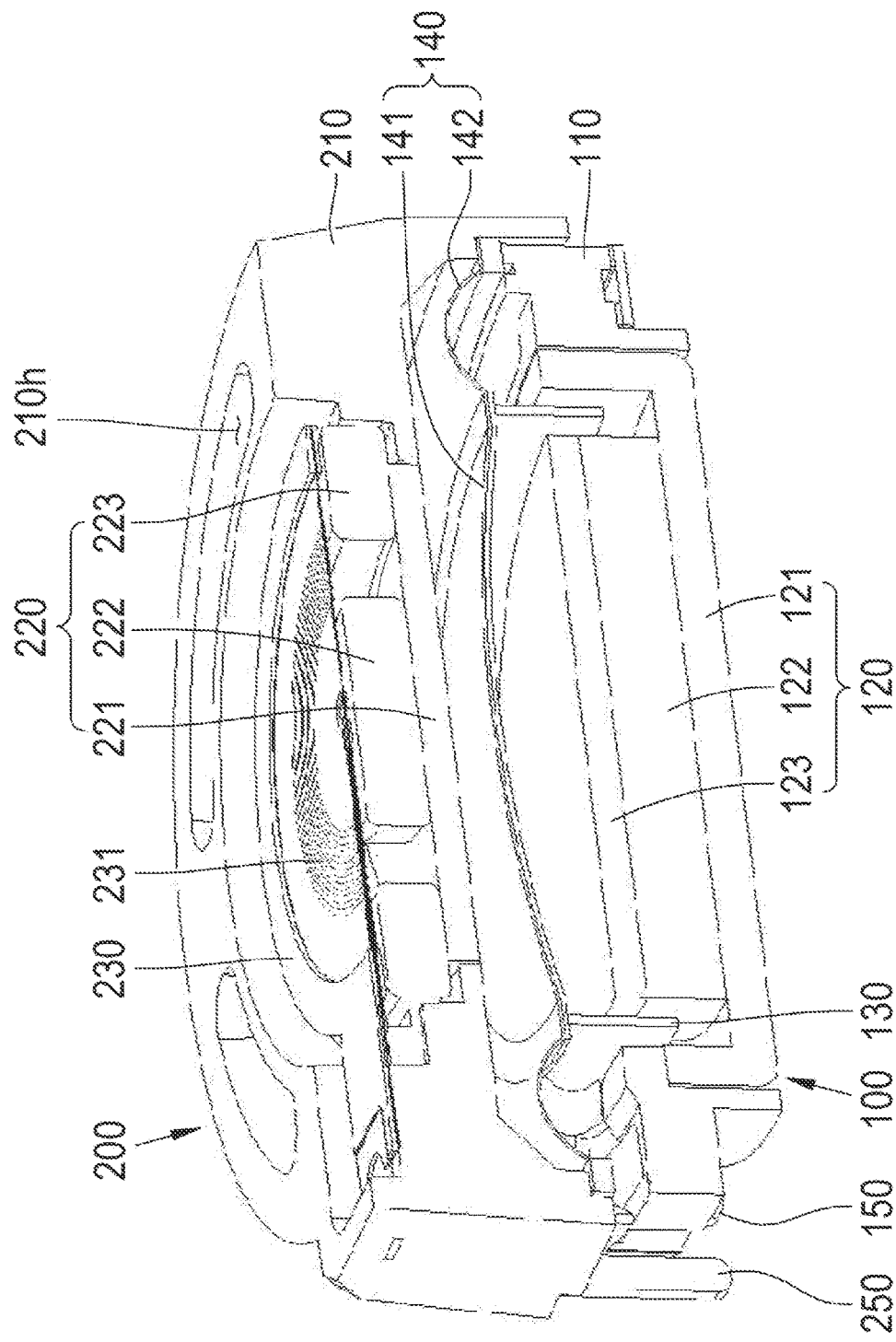
FIG. 2 is a side cross-sectional perspective view illustrating a hybrid speaker according to an embodiment.
Figure 3:
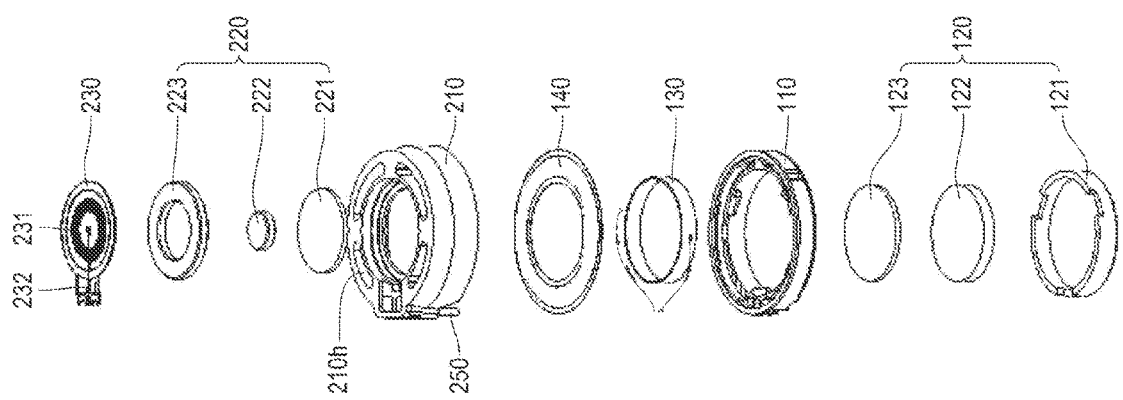
FIG. 3 is an exploded perspective view illustrating a hybrid speaker according to an embodiment.
Figure 4:
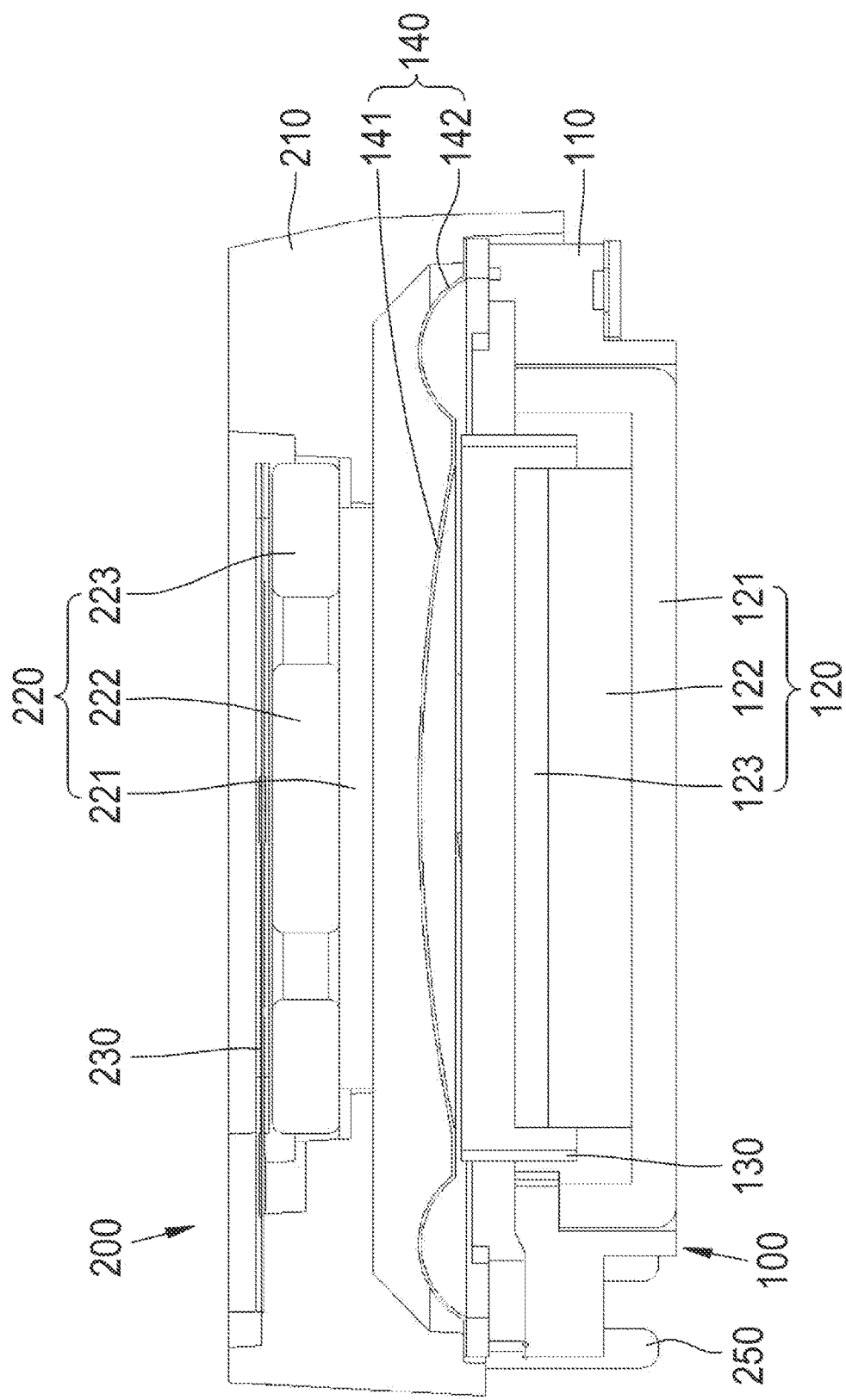
FIG. 4 is a side cross-sectional view of a hybrid speaker according to an embodiment.

Hereinafter, the present embodiment will be described in detail with reference to the accompanying drawings.

FIGS. 1 to 4 are diagrams illustrating a hybrid speaker according to an embodiment.

The hybrid speaker of an embodiment may include a dynamic speaker-type low-frequency range speaker 100 and a flexible printed circuit board (FPCB) microspeaker-type high-frequency range speaker 200 coupled to an upper side of the low-frequency range speaker 100.

The low-frequency range speaker 100 may include a frame 110 forming an exterior, a low-frequency range magnetic circuit 120 assembled inside the frame 110, a voice coil 130 vibrating by mutual electromagnetic force with the low-frequency range magnetic circuit 120, a diaphragm 140 vibrating with the voice coil 130 to generate sound, and a low-frequency range speaker terminal 150 exposed to the outside of the frame 110 to supply an external electrical signal to the voice coil 130.

The frame 110 is in the form of a plastic injection-molded product and may be configured in a cylindrical shape as a whole. The low-frequency range magnetic circuit 120 and the voice coil 130 may be installed inside the frame 110, and the diaphragm 140 may be installed above the frame 110. The frame 110 forms the exterior together with a bracket 210 to be described below. In order to be assembled with the bracket 210, a fastening structure, such as a recess portion or the like, may be provided at an upper portion of an outer circumference of the frame 110, but the present disclosure is not limited thereto.

The low-frequency range magnetic circuit 120 may include a lower yoke 121 having a disk-shaped lower surface and a cylindrical side surface, a disc-shaped magnet 122 disposed on the lower yoke 121, and a disc-shaped top plate 123 disposed on the magnet 122. The lower surface of the lower yoke 121 may be disposed below the frame 110 and the side surface of the lower yoke 121 may be disposed to be engaged with an inner circumferential surface of the frame 110, The magnet 122 may be disposed on a lower surface of the lower yoke 121 and may be disposed to form an air gap between the magnet 122 and the side surface of the lower yoke 121. The top plate 123 may have the same shape as that of the magnet 122 and may be disposed on the magnet 122 to form an air gap between the top plate 123 and the side surface of the lower yoke 121. An upper portion of the magnet 122 may be configured to have an N pole, and a lower portion of the magnet 122 may be configured to have an S pole.

The voice coil 130 is a coil member with a wire wound therearound, and a lower end of the voice coil 130 may be located in the air gap between the side surface of the lower yoke 121 and the magnet 122 and the top plate 123, and an upper end of the voice coil 130 may be fixed to the diaphragm 140. The wire of the voice coil 130 may be electrically connected to the low-frequency range speaker terminal 150 to be described below. When an external electric signal is applied to the voice coil 130, the voice coil 130 in a movable state may vibrate up and down by mutual electromagnetic force between the low-frequency range magnetic circuit 120 and the voice coil 130.

The diaphragm 140 may be seated on the upper side of the frame 110 and vibrates together with the voice coil 130 to generate sound. The diaphragm 140 may include a center diaphragm 141 attached to an upper end of the voice coil 130 and a side diaphragm 142 allowing the center diaphragm 141 to be vibrably mounted on the frame 110. While the center diaphragm 141 is formed to have a disk shape, the side diaphragm 142 may be formed to have a dome shape in cross-section. The center diaphragm 141 and the side diaphragm 142 may be manufactured separately, and then an outer circumference of the center diaphragm 141 may be coupled to an inner circumference of the side diaphragm 142, or the center diaphragm 141 and the side diaphragm 142 may be integrally configured.

The low-frequency range speaker terminal 150 may be formed as a pin terminal, may be connected to the wire of the voice coil 130, and may be disposed to be exposed to a lower portion of the frame 110. An external electrical signal may be supplied to the voice coil 130 through the low-frequency range speaker terminal 150. The low-frequency range speaker terminal 150 may be disposed to be adjacent to the high-frequency range speaker terminal 250 to be described below. The low-frequency range speaker terminal 150 and the high-frequency range speaker terminal 250 may be configured to receive external electrical signals separately or receive external electrical signals simultaneously.

The high-frequency range speaker 200 may include the bracket 210 assembled to an upper side of the frame 110 to form the exterior together with the frame 110, a high-frequency range magnetic circuit 220 assembled inside the bracket 210, an FPCB 230 vibrating by mutual electromagnetic force with the high-frequency range magnetic circuit 220 to generate sound, and a high-frequency range speaker terminal 250 exposed to the outside of the bracket to supply an external electrical signal to the FPCB 230.

The bracket 210 may be in the form of a plastic injection-molded product and may be configured to have a cylindrical shape as a whole or have a diameter gradually increasing downwardly. The high-frequency range magnetic circuit 220 may be installed inside the bracket 210, and the FPCB 230 may be installed above the bracket 210. The bracket 210 may form the exterior together with the frame 110, and a fastening structure, such as a recess portion or the like, may be provided at a lower portion of an inner circumferential surface of the bracket 210 to be assembled with the frame 110, but the present disclosure is not limited thereto.

In order to install the high-frequency range magnetic circuit 220, an upper portion of the inner circumferential surface of the bracket 210 is configured to be stepped several times, and a lower portion of the inner circumferential surface of the bracket 210 may be configured to have a somewhat wide space to allow the diaphragm 140 to be embedded therein. A lower end of the inner circumferential surface of the bracket 210 is configured to be stepped, and when the bracket 210 and the frame are assembled, the stepped portion of the bracket 210 may press the outer circumference of the diaphragm 140 to fix the diaphragm.

The bracket 210 may separately form a resonance space for resonating low-frequency range sound generated by the diaphragm 140 or may include holes 210h for transferring the low-frequency range sound generated by the diaphragm 140 to the outside or for ventilation.

The high-frequency range magnetic circuit 220 may be configured to form a magnetic field below the FPCB 230. The high-frequency range magnetic circuit 220 may include a disk-shaped upper yoke 221, a disk-shaped inner magnet 222 disposed on the upper yoke 221, and a ring plate-shaped outer magnet 223 disposed to form an air gap outside the inner magnet 222. An upper portion of the inner magnet 222 may be configured to have an N pole and a lower portion of the inner magnet 222 may be configured to have an S pole, while an upper portion of the outer magnet 223 may be configured to have an S pole and a lower portion of the outer magnet 223 may be configured to have an N pole.

The FPCB 230 may be disposed above the inner magnet 222 and the outer magnet 223 and supported by the bracket 210. The FPCB 230 may be in the form of a PCB having a certain coil pattern 231 to which an external electrical signal is transmitted, and may be vibrated by mutual electromagnetic force with a magnetic field of the high-frequency range magnetic circuit 220.

Like the low-frequency range speaker terminal, the high-frequency range speaker terminal 250 may be formed as a pin terminal, may be connected to the FPCB 230, and may be disposed to be exposed to a lower portion of the bracket 210. An external electrical signal may be supplied to the coil pattern of the FPCB 230 through the high-frequency range speaker terminal 250. The high-frequency range speaker terminal 250 may be disposed to be adjacent to the low-frequency range speaker terminal 150 to be located in the same direction, and the high-frequency range speaker terminal 250 and the low-frequency range speaker terminal 150 may be configured to receive external electric signals separately or receive external electric signals simultaneously.

According to the hybrid speaker configured as described above, when the lower frame 110 and the upper bracket 210 are assembled to each other, the low-frequency range speaker 100 and the high-frequency range speaker 200 may be coaxially coupled. Since the low-frequency range speaker 100 and the high-frequency range speaker 200 are integrally configured, distortion and heterogeneity of sound due to a phase difference may be minimized and both low-frequency range sound characteristics and high-frequency range sound characteristics may be improved.

Figure 5:
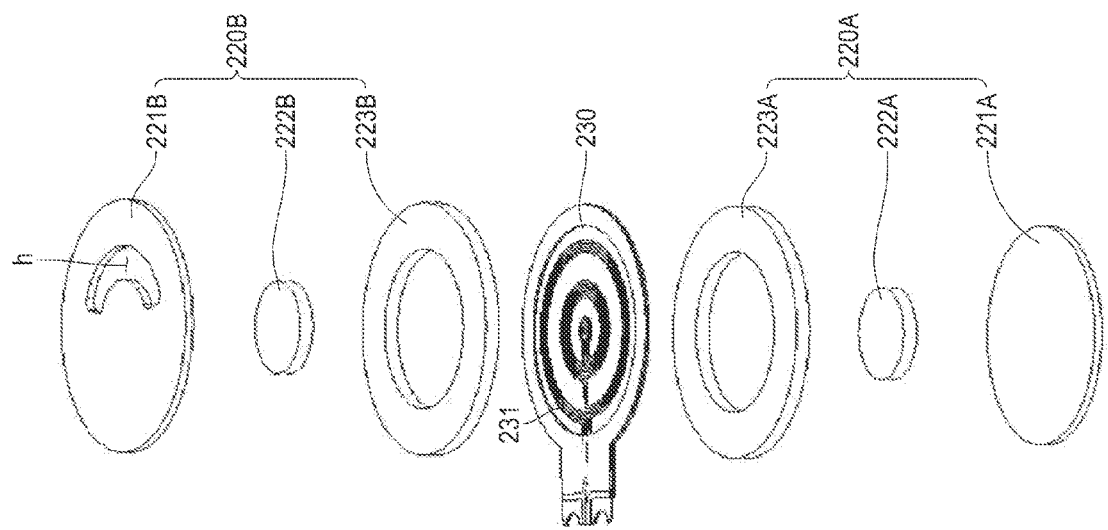
FIG. 5 is an exploded perspective view illustrating a high-frequency range speaker having a twin magnetic field structure applicable to an embodiment.
Figure 6:
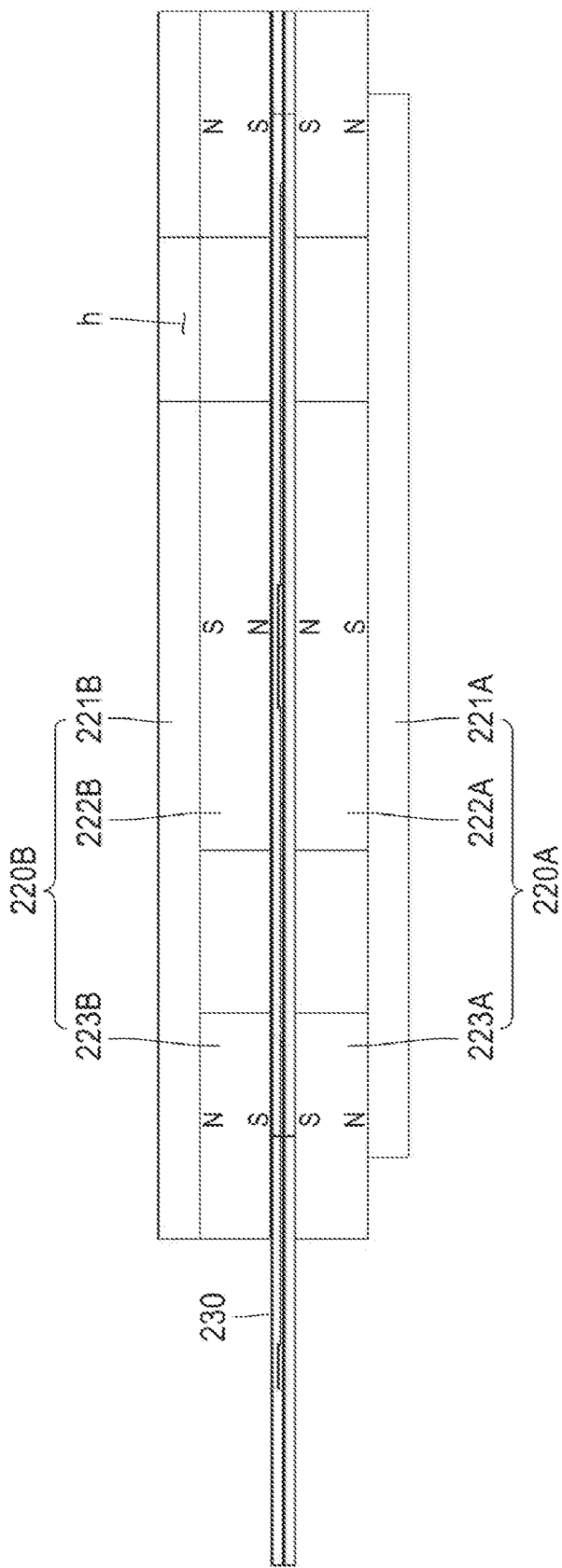
FIG. 6 is a side cross-sectional view illustrating a high-frequency range speaker having a twin magnetic field structure applicable to an embodiment.

FIGS. 5 and 6 are an exploded perspective view and a side cross-sectional view, respectively, illustrating a high-frequency range speaker having a twin magnetic field structure applicable to an embodiment.

In order to generate larger high-frequency range sound, a high-frequency range speaker may be configured to include first and second magnetic circuits 220A and 220B forming a pair of symmetrical magnetic fields above and below the FPCB 230.

The first magnetic circuit 220A may be configured to form a magnetic field below the FPCB 230. The first magnetic circuit 220A may include a disk-shaped first yoke 221A, a disk-shaped first inner magnet 222A disposed on the first yoke 221A, and a ring plate-shaped first outer magnet 223A arranged to form an air gap outside the first inner magnet 222A. An upper portion of the first inner magnet 222A may be configured to have an N pole and a lower portion of the first inner magnet 222A may be configured to have an S pole, while an upper portion of the first outer magnet 223A may be configured to have an S pole and a lower portion of the first outer magnet 223A may be configured to have an N pole.

The second magnetic circuit 220B may be configured to form a magnetic field above the FPCB 230. The second magnetic circuit 220B may include a disk-shaped second yoke 221B, a disk-shaped second inner magnet 222B disposed below the second yoke 221B, and ring plate-shaped second outer magnet 223B disposed to form an air gap outside the second inner magnet 222B. An upper portion of the second inner magnet 222B may be configured to have an S pole and a lower portion of the second inner magnet 222B may be configured to have an N pole, while an upper portion of the second outer magnet 223B may be configured to have an N pole and a lower portion of the second outer magnet 223B may be configured to have an N pole.

The first and second yokes 221A and 22B, the first and second inner magnets 222A and 222B, and the first and second outer magnets 223A and 223B may have the same shape and same size.

Meanwhile, the second yoke 221B may include a hole h for transferring high-frequency range sound generated by the FPCB 230 to the outside, and the hole h may have a certain circular arc shape to correspond to an air gap formed between the second inner magnet 222B and the second outer magnet 223B.

Figure 7:
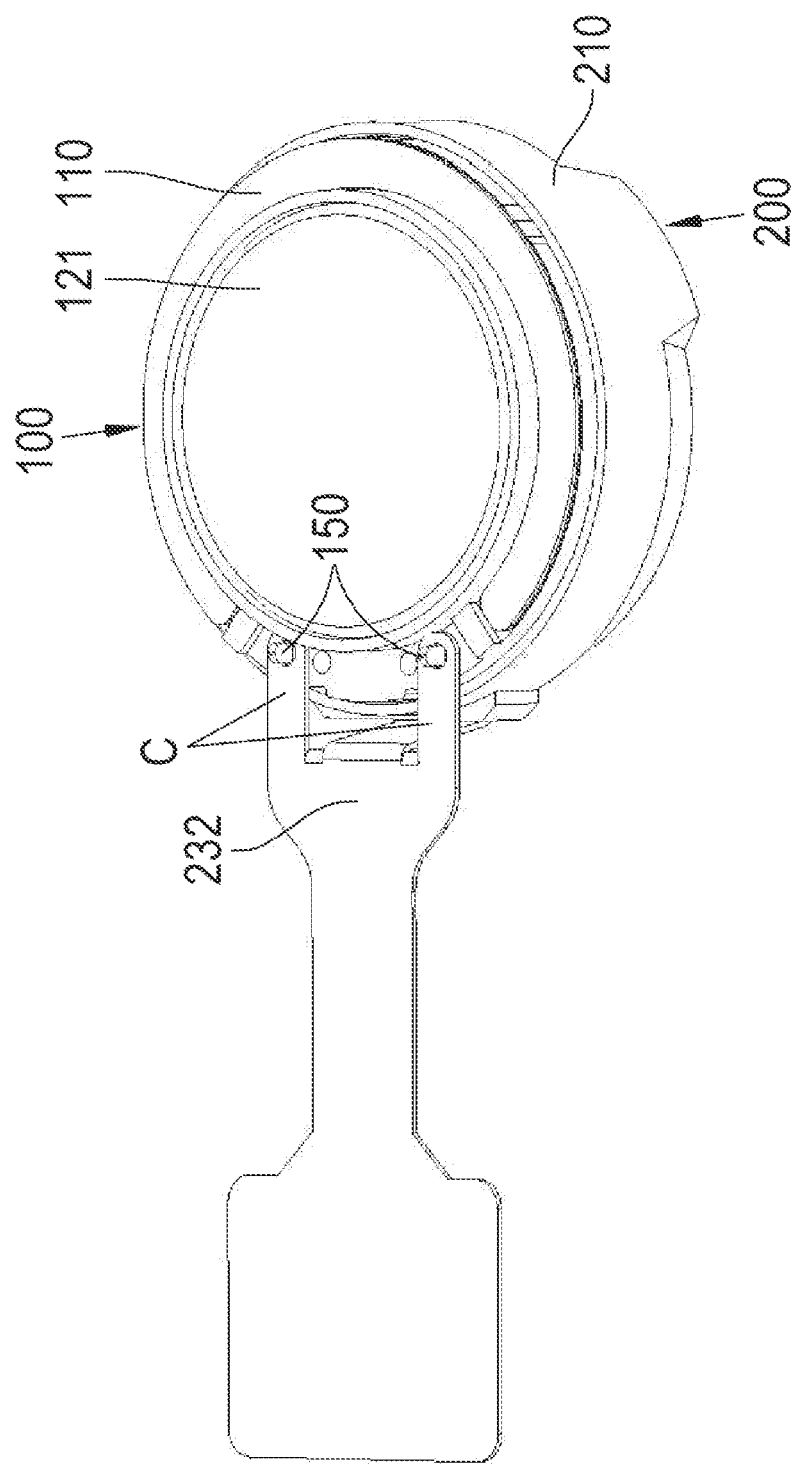
FIG. 7 is a perspective view illustrating a connection structure of a low-frequency range speaker terminal and a high-frequency range speaker terminal applicable to an embodiment.

FIG. 7 is a perspective view illustrating a connection structure of a low-frequency range speaker terminal and a high-frequency range speaker terminal applicable to an embodiment.

A terminal for supplying an electric signal to the low-frequency range speaker 100 is configured as a conductive pin terminal 150, while a terminal for supplying an electrical signal to the high-frequency range speaker 200 may be configured as a substrate extending portion 232 partially extending from the conductive FPCB. The pin terminal 150 may be exposed from a lower portion of the frame 110, and the substrate extending portion 232 may be exposed from a lower portion of the bracket 210 in the same direction as that of the pin terminal 150. The substrate extending portion 232 may include a cutout portion C in which a portion thereof is cut out, and the cutout portion C may be connected to the pin terminal 150.

Accordingly, when an external electrical signal is applied to the substrate extending portion 150, the electrical signal may be supplied to the voice coil on the side of the low-frequency range speaker 100 through the cutout portion C and the pin terminal 150, and at the same time, may be supplied to the FPCB on the side of the high-frequency range speaker 200 through the substrate extending portion 232, and thus, the low-frequency range speaker 100 and the high-frequency range speaker 200 may be operated simultaneously.

Figure 8:
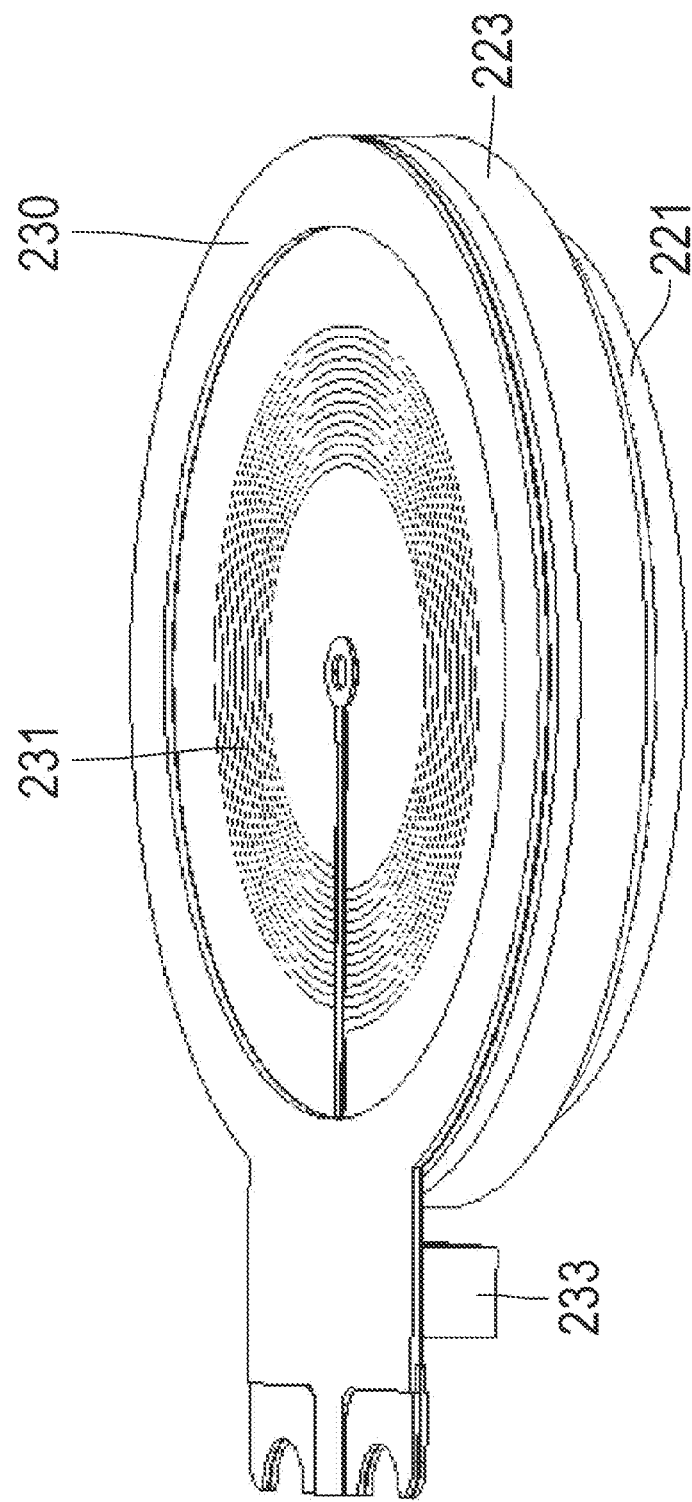
FIG. 8 is a perspective view illustrating a high-frequency range speaker applicable to an embodiment.

FIG. 8 is a perspective view illustrating a high-frequency range speaker applicable to an embodiment.

In order to improve quality of high-frequency range sound, a capacitor 233 may be disposed on the FPCB 230 in the high-frequency range speaker. Since the capacitor 233 serves as a high-pass filter, the FPCB 230 vibrates only in a high-frequency range even if an electric signal is supplied to the coil pattern 231.

The above description is merely an example of the technical idea of the present disclosure, and various modifications and variations may be made to those skilled in the art without departing from the essential characteristics of the present disclosure.

Therefore, the embodiments disclosed in the present disclosure are not intended to limit the technical idea of the present disclosure, but to explain, and the scope of the technical idea of the present disclosure is not limited by these embodiments.

The protection scope of the present disclosure should be construed according to the following claims, and all technical ideas within the equivalent range should be construed as being included in the scope of the present disclosure.

What is claimed is:

1. A hybrid microspeaker comprising:
a low-frequency range speaker including a frame, a low-frequency range magnetic circuit installed inside the frame, a voice coil configured to vibrate by mutual electromagnetic force with the low-frequency range magnetic circuit, and a diaphragm seated on the frame and configured to vibrate with the voice coil to generate sound; and
a high-frequency range speaker including a bracket coupled to an upper portion of the frame, a high-frequency range magnetic circuit installed inside the bracket, and a flexible printed circuit board (FPCB) seated on the bracket and including a pattern configured to vibrate by mutual electromagnetic force with the high-frequency range magnetic circuit to generate sound,
wherein the low-frequency range speaker further includes a low-frequency range speaker terminal exposed to the outside of the frame to be connected to the voice coil to supply an electrical signal,
wherein the high-frequency range speaker further includes a high-frequency range speaker terminal exposed to the outside of the bracket to be connected to the FPCB to supply an electrical signal,
wherein the low-frequency range speaker terminal is configured in the form of a pin terminal,
wherein the high-frequency range speaker terminal is configured such that a portion of the FPCB extends to be exposed to the outside of the bracket,
wherein a cutout portion of the high-frequency range speaker terminal is connected to the low-frequency range speaker terminal.

2. The hybrid microspeaker of claim 1, wherein the low-frequency range magnetic circuit includes:
a yoke coupled to an inner circumferential surface and a lower side of the frame;
a magnet disposed inside the yoke with an air gap therebetween; and
a top plate disposed above the magnet,
wherein a lower end of the voice coil is disposed in the air gap between a side surface of the yoke and the magnet.

3. The hybrid microspeaker of claim 1, wherein the high-frequency range magnetic circuit includes a first magnetic circuit forming a magnetic field below the FPCB.

4. The hybrid microspeaker of claim 3, wherein the first magnetic circuit includes:
a first inner magnet disposed below the FPCB;
a first outer magnet arranged to form an air gap outside the first inner magnet; and
a first yoke disposed below the first inner magnet and the first outer magnet.

5. The hybrid microspeaker of claim 4, wherein the high-frequency range magnetic circuit further includes a second magnetic circuit forming a magnetic field symmetrical to the first magnetic circuit above the FPCB.

6. The hybrid microspeaker of claim 5, wherein the second magnetic circuit includes:
a second inner magnet disposed above the FPCB;
a second outer magnet disposed to form an air gap outside the second inner magnet; and
a second yoke disposed above the second inner magnet and the second outer magnet and including a sound hole communicating with the air gap.

7. The hybrid microspeaker of claim 1, wherein the FPCB further includes a capacitor operating only in a high frequency range.

* * * * *